United States Patent [19]
Mirov et al.

[11] Patent Number: 5,491,442
[45] Date of Patent: Feb. 13, 1996

[54] MULTIPLE FREQUENCY OUTPUT CLOCK GENERATOR SYSTEM

[75] Inventors: Russell N. Mirov, San Jose; Duc N. Le, Santa Clara; Frank Mikalauskas, San Jose; C. John Grebenkemper, Saratoga; Kinying Kwan, San Jose, all of Calif.

[73] Assignee: Tandem Computers Incorporated, Cupertino, Calif.

[21] Appl. No.: 442,851

[22] Filed: May 17, 1995

Related U.S. Application Data

[62] Division of Ser. No. 289,823, Oct. 3, 1994, which is a continuation of Ser. No. 87,556, Jul. 2, 1993, Pat. No. 5,371,417.

[51] Int. Cl.⁶ ............................ G06F 1/04; H03K 3/00
[52] U.S. Cl. .................... 327/295; 327/115; 327/415
[58] Field of Search ........................... 327/113–117, 291, 327/293, 294, 295, 403, 404, 415, 416

[56] References Cited

U.S. PATENT DOCUMENTS

| | | | |
|---|---|---|---|
| 4,637,018 | 1/1987 | Flora et al. | 327/152 |
| 4,677,322 | 6/1987 | Burson et al. | 327/42 |
| 4,796,095 | 1/1989 | Slimada | 327/99 |
| 4,835,481 | 5/1989 | Geissler et al. | 327/291 |
| 4,876,701 | 10/1989 | Sanner | 327/141 |
| 4,912,564 | 3/1990 | Saitoh | 327/291 |
| 5,087,829 | 2/1992 | Ishibashi et al. | 327/152 |
| 5,341,031 | 8/1994 | Kinoshita et al. | 327/115 |

*Primary Examiner*—Toan Tran
*Attorney, Agent, or Firm*—Townsend and Townsend and Crew

[57] ABSTRACT

A clock generator produces a plurality of clock signals from a master clock and a delayed clock version of the master clock by applying a division of the delayed version of the master clock to the data input of a flip-flop and clocking the flip-flop with the master clock. A number of plurality of clock signals are produced by applying the output of the flip-flop to the data input of an array of second flip-flops—one flip-flop of the array for each of the number of clock signals—that are clocked by the delayed version of the master clock.

5 Claims, 7 Drawing Sheets

MULTIPLE FREQUENCY OUTPUT CLOCK GENERATOR SYSTEM

This is a division of application Ser. No. 08/289,823, filed Oct. 3, 1994 which is a continuation of U.S. Ser. No. 08/087,556, filed Jul. 2, 1993, (now U.S. Pat. No. 5,371,417, issued Dec. 6, 1994).

BACKGROUND OF THE INVENTION

The present invention relates generally to digital data processing systems, and more particularly to a clock generator system that produces a number of clock signals, some of a frequency different from the others.

Data processing systems constructed today often use a number of individual integrated circuit component mounted on printed circuit boards and electrically interconnected to one another. For synchronous operation of data processing systems there is often also provided source of a digital clock signal that is distributed to the integrated circuit devices mounted on that board. For lower frequency clock signals (eg, clock signals on the order of 1 Mhz and less), clock skew may not be a significant problem. However, as systems are developed to use clock frequencies that are much higher (e.g., greater than 1 Mhz) clock skew (i.e., the difference between the occurrence of a transition of a clock signal as seen at points relative to that occurrence at another point) can become a significant problem.

One solution is to handle information transfers between integrated circuits asynchronously through intermediate registers or the like. Another approach is to use phase locked loops (PLLs), but these devices often require a reference signal in order to maintain a phase relation between the reference and the output clock signals. At times, there is jitter encountered between the clock signals of the comparison that create a jitter in the output signals. In addition, PLLs that are implemented in analog form tend to be susceptible to power supply noise. In addition, analog PLLs require additional components.

SUMMARY OF THE INVENTION

The present invention is a clock generator system that includes a pair of substantially identically structured clock generator units, respectively termed "Master" and "Shadow." The clock generator units operate in lock-step synchronism to each produce a plurality of high frequency clock signals of at least three different (but related) frequencies. Only the clock signals produced by the master clock generator unit are distributed throughout the apparatus incorporating the clock generator system. The clock signals produced by the shadow clock generator unit are compared to their counterparts produced by the master clock generator unit by a self-checking, error-checking logic to ensure proper operation of the clock generator system.

In the preferred embodiment of the invention, each clock generator unit includes a configurable frequency divider that receives an oscillator produced master clock signal to provide therefrom three different divided versions of master clock signals, two of which are selectively modifiable. The clock signals produced by the frequency divider are coupled to a registration output unit that aligns state transitions of the clock signals before they leave the clock generator system for distribution, and adds to certain groups of the clock signals a selectable skew that compensates for known clock delays that will be encountered by one type of integrated circuit as opposed to another type of unit.

Self-checking dual-railed error detection logic receives the clock signal outputs produced by the two clock generators to compare one another against the other. If an error in any one of the clock signals produced by either of the clock generator units is detected, an error signal is produced and latched. In addition, the error signal is coupled to reset circuitry to reset the frequency dividers of the two clock generators, providing the clock generator system with a self-resetting capability.

DETAILED DESCRIPTION OF THE INVENTION

Figure 1:
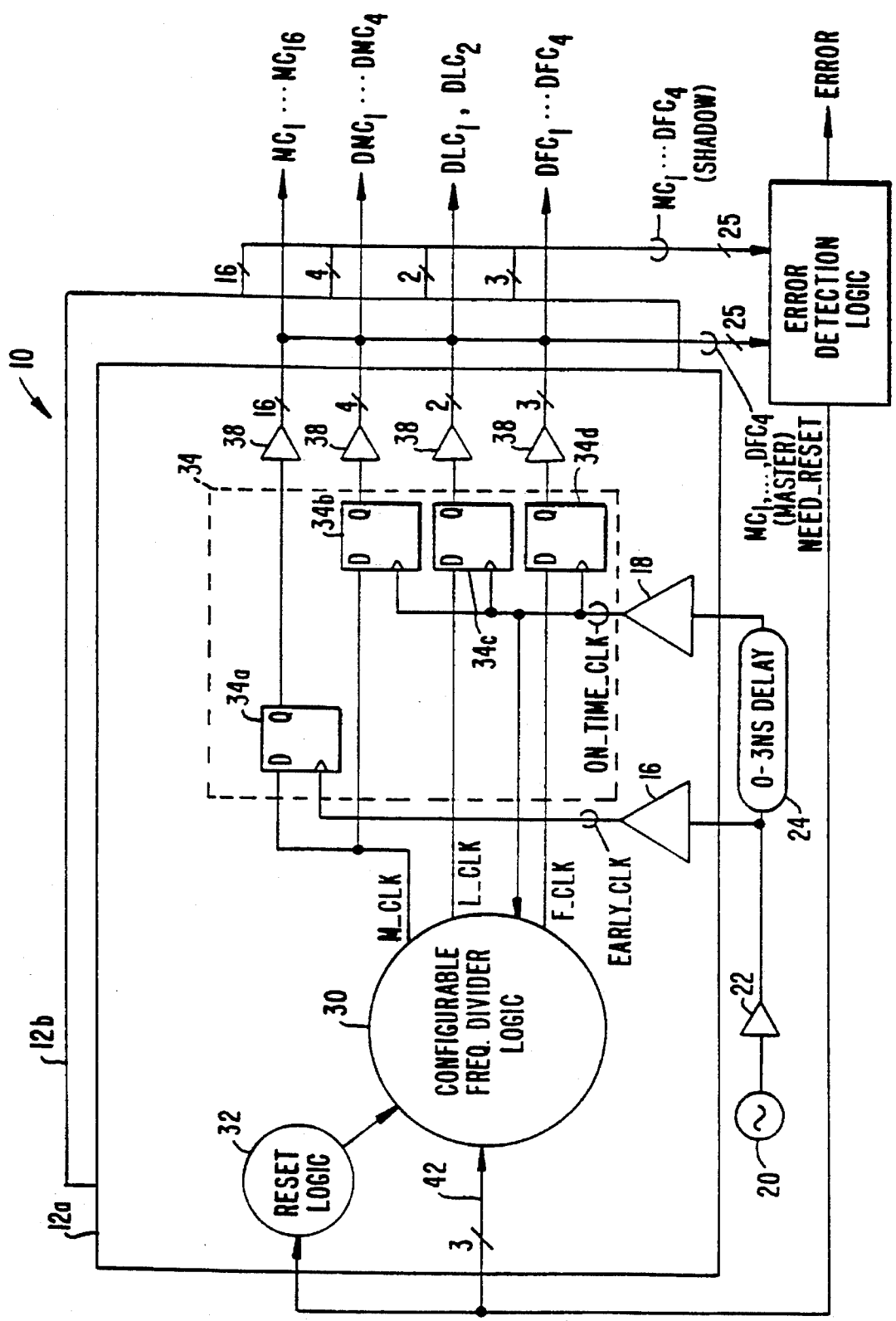
FIG. 1 is a simplified block diagram of the clock generator system of the present invention, illustrating the system as including the two individual clock generator units (master and shadow), and the general construction of each clock generator unit.

Turning now to the figures, and for the moment specifically FIG. 1, there is illustrated a clock generator system constructed according to the present invention. Designated generally with the reference numeral 10, the clock generator system includes a pair of substantially identically constructed clock generator units 12a ("master") and 12b ("shadow"). Both clock generator units 12a, 12b receive the same input signal, and provide the same output (clock) signals. However, it is only the clock output signals of the master clock generator unit 12a that is used by other synchronous, clocked devices. Since, as indicated, the two clock generator units 12a, 12b are substantially identical in construction, only a discussion of the master clock generator unit 12a will be provided, it being understood, however, that the discussion will apply equally to the shadow clock generator unit 12b, unless otherwise noted.

As FIG. 1 shows, the master clock generator unit 12a receives at input receivers 16, 18 a clock signal that is the product of a clock oscillator 20 (via a buffer 22). The input receiver 16 receives the clock directly, providing therefrom an EARLY_CLK signal. The input receiver 18, on the other hand, receives the same clock signal, but delayed by the (variable) delay line 24 by up to three nanoseconds, providing therefrom an ON_TIME_CLK clock signal.

A configurable frequency divider 30 receive the ON_TIME_CLK clock signal, operating to produce therefrom three separate clock signals, F_CLK, M_CLK, and L_CLK, each of a different frequency. These clock signals (F_CLK, M_CLK, L_CLK) are supplied to an output registration section 34 that operates to replicate each of the clock signals, producing four groups of clock signals: three groups (DMC$_1$, . . . , DMC$_4$; DLC$_1$, DLC$_2$; and DFC$_1$, . . . , DFC$_4$) are replicas of the M_CLK, L_CLK, and F_CLK signals, and the fourth group of clock signals (MC$_1$, . . . , MC$_{16}$) is produced from the M_CLK signal. In addition, the output registration section 34 operates to keep the skew of clock signals within one output frequency group at as low as possible.

The output registration section includes register groups 34a, 34b, 34c, and 34d that, as will be seen (e.g., FIG. 4) represent groups of D-type registers, one for each clock signal output from the master clock generator unit 12a. The registers of the register groups 34a, . . . , 34d receive, as input data, the F_CLK, M_CLK, L_CLK signals produced by the configurable frequency divider 30. The register groups 34a, . . . , 34d are either clocked by the EARLY_CLK clock signal or the ON_TIME_CLK clock signal. The output clock signals from those register groups clocked by the ON_TIME_CLK signal will be delayed (skewed) by amount determined by the delay line 24 from those output signals produced by the register groups clocked by the EARLY_CLK signal. The output clock signals are buffered by line drivers 38 before leaving the master clock generator unit 12a.

The clock generator system 10 includes error detection logic 40 that receives the 25 output clock signals from the master clock generator unit 12a, as well as the substantially identical 25 output clock signals from the shadow clock generator unit 12b. The error detection logic 40 compares each one of the master clock output signals to its counterpart shadow output clock signal. When a mismatch is detected, the error detection logic will issue an ERROR signal to the processing system with which it is used, preferably to terminate operation at that point. However, there are reasons to maintain the clock signals for error detection and reporting circuitry and, therefore, the error detection logic will also produce a NEED_RESET signal that is coupled to a reset logic unit 32 of the master clock generator unit 12a. The reset logic 32 operates to produce a reset signal that is coupled to reset the configurable frequency dividers 30 of both the master and the shadow clock generator units 12a, 12b to the same, reset state, causing both to start afresh in the hopes of recovering from the error detected.

As will be seen, the configurable frequency divider 30 is capable of providing one of eight divisions of the ON_TIME_CLK signal. Selection of which clock rate is made by information communicated to the configurable frequency divider 30 by the 3-bit selection bus 42.

Digressing for a moment, the clock system 10 is constructed to, among other things, compensate for skew that may be encountered when using both application specific integrated circuit (ASIC) devices (e.g., devices that may be formed "in-house" such as gate array devices with customer-specified interconnections) and non-ASIC devices (e.g., devices that are commercially available on the open market). ASIC devices, because of certain requirements, may include some gating of the received clock signals before being applied to a first clocked device (e.g., a register). Non-ASCI devices may, on the other hand, contain clocked devices that receive the applied clock signal with directly so that virtually no delay is imposed, relative to the first clocked device of the ASIC device. It is this difference or skew that is compensated for by the skewing of certain of the output signals relative to others.

Figure 2:
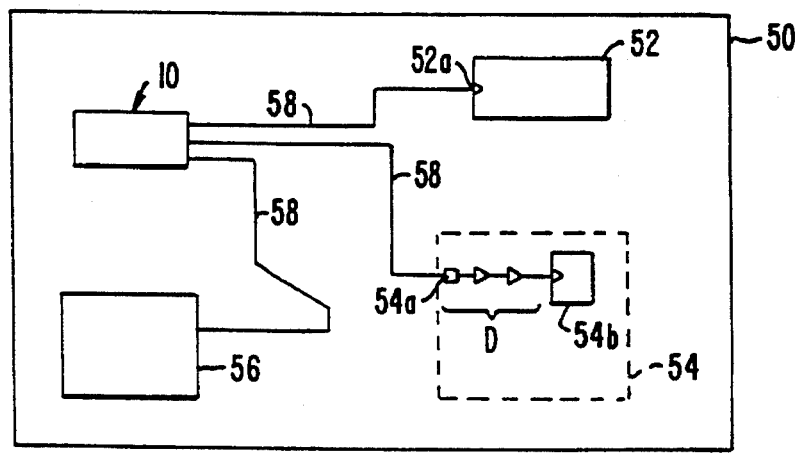
FIG. 2 is a simplified illustration of a printed circuit board that may carry the clock generator system of the present invention, illustrating distribution of clock signals thereon, and delays may be encountered on certain integrated circuits, as opposed to other integrated circuits, for which clock skew compensation is added.

This is illustrated in FIG. 2, in which the clock generator system 10 of the present invention is shown mounted on a printed circuit board 50 together with a plurality of other integrated circuit devices represented by non-ASIC device 52, the ASIC device 54, and device 56. The clock system 10 (e.g., the master clock generator unit 12a, since only it supplies output clock signals to anything other than the error detection logic 40) is coupled to the other devices 52, 54, 56 by printed circuit paths 58 which to communicate output clock signals thereto.

Typically the non-ASIC device 52 may be such an off-the-shelf item such as, for example, a microprocessor chip or the like, constructed have a register or some other device connected to receive clock signals directly from the input pad 52a of the device so that virtually no delay is encountered. Conversely, ASIC device 54 may have delay (D) introduced between the input pad 54a whereat the clock signal is received and the first clocked device 54b. This delay, if known, can be made the subject of compensation so transitions of the received clock signal seen by the first clock element of the non-ASIC device 52 (assumed to be at the input pad 52a) will be seen to occur by the clocked device 54b of the ASIC device 54 at substantially time (or with a minimum of skew). This is the function of clocking the output register groups 34a, . . . , 34d with the EARLY_CLK signal and the delayed version of the EARLY_CLK signal, the ON_TIME_CLK signal. Thus, group of output signals MC$_1$, . . . , MC$_{16}$, are clock signals for use by devices that apply the received clock signal directly from the input terminal where is received to a clock input of a clocked device, while the signals that are skewed by an amount determined by the delay line 24 can be applied to devices (e.g., ASIC device 54) that impose skew on the received clock before it is allied to a first clock device. Of course, the delay created by the delay line 24 would be configured to match (and compensate for) that delay (D) imposed at the ASIC device 54 before it receives the clock input of the first clocked device 54b.

The delay line 24 is formed by laying a printed circuit trace on the printed circuit board 50, and may be adjusted by trimming that trace, although it will be evident to those skilled in this art that other forms of delay (e.g., gates, etc.) may be used depending upon the circumstances and environment within which the delay is used. Here, the present invention was designed for use with oscillator 20 producing clock signals on the order of 100–200 Mhz. At these frequencies, a delay of 0–3 nanoseconds is enough to compensate, as described below, for any additional skew introduced by the ASIC device(s), relative to the non-ASIC devices.

FIG. 2 also illustrates another approach to minimize skew: the physical length of each of the individual printed circuit path 58 is substantially identical in length, regardless of the location of the device relative to the location of the clock generator system 10 on the board 50. In the present invention, that length (e.g., a system containing printed circuit boards on the order of about 20 inches on a side) is 25 inches. Thus, any skew imparted by the path 58 in the output clock signals communicated from the clock generator system 10 to the devices 52, . . . , 56 will be substantially the same. It will be evident to those skilled in this art that the actual layout of the paths will have to be done so that any cross-coupling from one portion of the path to another, or between paths, will be minimized.

Figure 3:
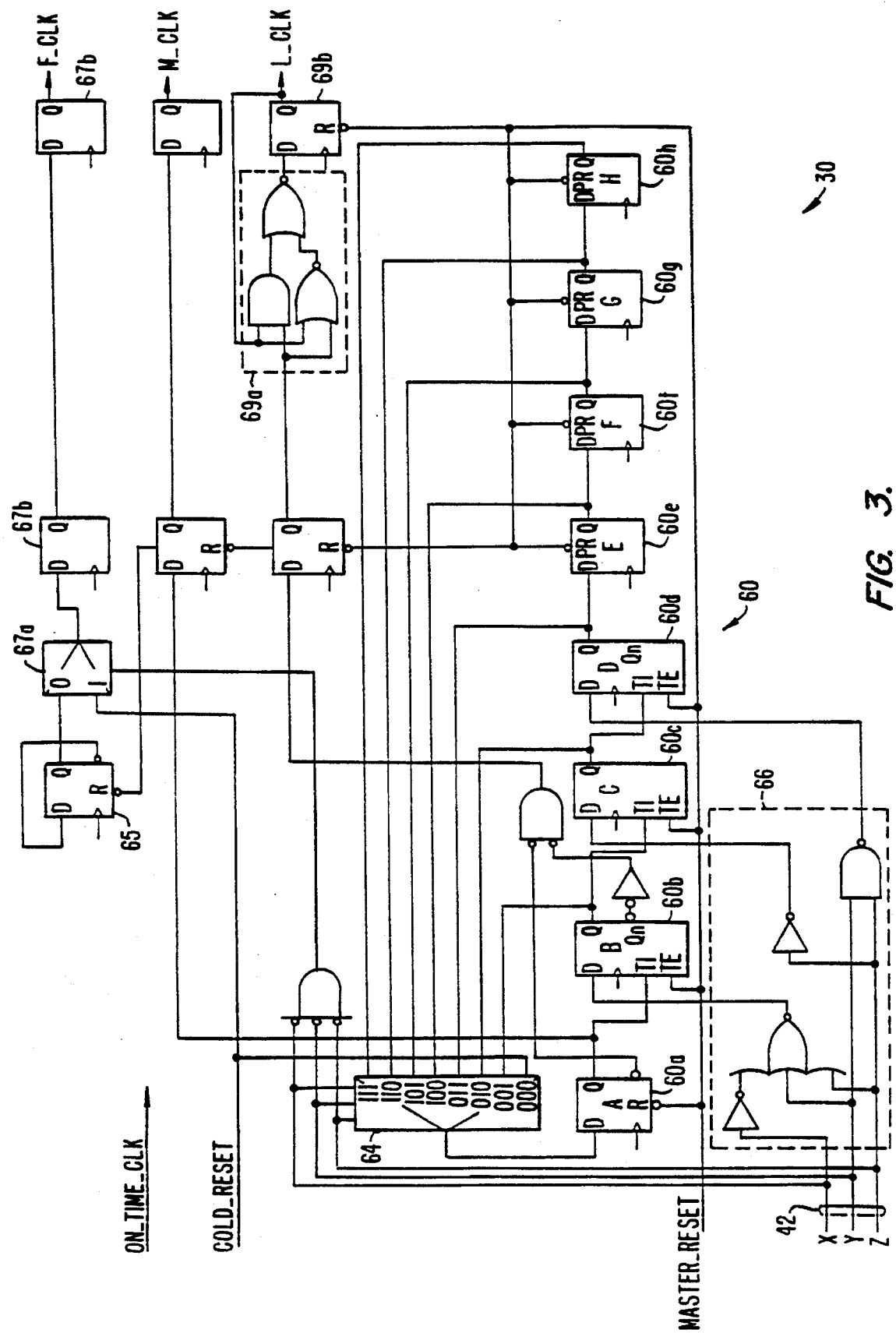
FIG. 3 is a schematic diagram of the configurable frequency divider logic shown in FIG. 1.

Turning now to FIG. 3, the configurable frequency divider 30 is illustrated in greater detail. The heart of the configurable frequency divider 30 is a eight-stage ring counter, structured as a Johnson counter 60 to maximize the frequency of operation. The ring counter 60 includes the individual flip-flops 60a, 60b, . . . 60h. The outputs of each the flip-flops 60a, . . . , 60h are coupled to a multiplexer (MUX) 64, whose output is returned to the data (D) input of the first stage 60a of the ring counter 60.

The flip-flops 60a, 60e, 60f, 60g, and 60h are edge-triggered (positive clock transition) D-type flip-flops of conventional design. The flip-flops 60b, 60c, and 60d are edge-triggered (positive transition) scan test type flip-flops in that they have two data inputs (data (D) and test in (TI)), only one of which is enabled at any one time depending upon the state of the signal applied to the test enable (TE) input. For example, referring to the flip-flop 60b, when the signal (MASTER_RESET) applied to the TE input is LOW, the data signal applied to the data (D) will be accepted and retained by the flip-flop on the rising transition of the clock signal applied to its clock input (symbolized by the right pointing triangles). On the other hand, when MASTER_RESET is HIGH, the flip-flop will accept the data signal at its test in (TI) input. Thus, in the structure of the ring counter 60 shown in FIG. 3, the flip-flops 60b–60d will accept data from the data output of immediately preceding flip-flop in the chain when MASTER_RESET is HIGH. When the MASTER_RESET signal is LOW, the flip-flops 60b–60d are preset with values developed by frequency selection logic 66 and applied at their data (D) inputs, in a manner, and for reasons, that are explained further below.

The ring counter 60 receives, and operates to divide, the ON_TIME_CLK. (unless otherwise stated, all clock devices, i.e., flip-flops, shown in FIG. 3 receive the ON_TIME_CLK signal at their clock inputs.) The ring counter 60 develops three separate divisions of the ON_TIME_CLK signal: a fast clock (F_CLK) signal of a frequency one-half that of the frequency of the ON_TIME_CLK signal; a medium clock (M_CLK) signal the frequency of which is determined by the signals (X, Y, Z) received on the selection bus 42; and a low clock (L_CLK) signal with a frequency always one-half that of the M_CLK signal.

In a preferred embodiment of the invention the oscillator 20 is capable of producing (depending upon the crystal used, it being a crystal-controlled oscillator) one of the three clock signals: 100 Mhz, 150 Mhz, or 200 Mhz. For this reason, as indicated, the ring counter 60 is in the form of a Johnson counter to maximize the frequency of operation. Further, and for the same reason, care should be taken to reduce the levels of logic within the divider ring. The division ratio of the divider is determined by the pattern in the ring, and the length of the ring. The pattern is loaded into the counter 60 when the MASTER_RESET signal (an active LOW) is asserted (i.e., brought LOW).

The length of the ring counter, and therefore the frequencies of the M_CLK and L_CLK signals, is determined by the 8 to 1 MUX 64 that selects the desired output from one of the flip-flops 60a, . . . 60h. The ring counter 60 is preset as follows: The particular frequency desired is selected by asserting one or more of the signals X, Y, Z on the selection bus 42. Those signals are applied, through the frequency select logic 66, to the data (D) inputs of the flip-flops 60b, 60c, and 60d. The M_ASTER_RESET signal is asserted (i.e., brought LOW), setting the desired values into the flip-flops 60b, 60c, and 60d, while the remaining flip-flops of the counter 60 are cleared. Table I, below, illustrates the eight possible division values of the counter 60, resulting from the values of X, Y, and Z, and the values of M_CLK for the oscillator frequencies of 100 Mhz, 150 Mhz, and 200 Mhz.

| | | | RESET VALUE | | | | | | | | Div Ratio | Duty Cycle | 100 Mhz Input | 150 Mhz Input | 200 Mhz Input |
|---|---|---|---|---|---|---|---|---|---|---|---|---|---|---|---|
| X | Y | Z | A | B | C | D | E | F | G | H | | | | | |
| 0 | 0 | 0 | | | | | | | | | | | | | |
| 0 | 1 | | 0 | 1 | | | | | | | ÷2 | 50/50 | 50.0 MHz | 75.0 MHz | 100.0 MHz |
| 0 | 1 | 0 | 0 | 1 | | | | | | | ÷3 | 33/66 | 33.3 MHz | 50.0 MHz | 66.6 MHz |
| 0 | 1 | | 0 | 1 | | | | | | | ÷4 | 50/50 | 25.0 MHz | 37.5 MHz | 50.0 MHz |
| 1 | 0 | | 0 | 1 | | | | | | | ÷5 | 40/60 | 20.0 MHz | 30.0 MHz | 40.0 MHz |
| 1 | 0 | 1 | 0 | 1 | | | | | | | ÷6 | 50/50 | 16.6 MHz | 25.0 MHz | 33.3 MHz |
| 1 | 0 | | 0 | 1 | | | | | | | ÷7 | 43/57 | 14.1 MHz | 21.4 MHz | 26.6 MHz |
| 1 | | | 0 | 1 | 1 | 1 | 1 | | | | ÷8 | 50/50 | 12.5 MHz | 18.8 MHz | 25.0 MHz |

Table I illustrates the frequency assumed by the M_CLK signal for given values of X, Y, and Z, and for oscillator 20 frequency values of 100 Mhz, 150 Mhz, and 200 Mhz. As indicated above, the frequency of the F_CLK signal is one-half that of the ON_TIME_CLK signal, and is developed by the toggle-configured flip-flop 65, and coupled to the output registration section 34 (FIG. 1) by the multiplexer 67a, and flip-flops 67b. The M_CLK signal, developed by the ring counter 60, is taken from the output of the first stage (flip-flop 60a) of the ring counter, and coupled to the output registration section 34 by flip-flops 68 (i.e., 68a, 68b). Finally, the L_CLK signal, which has a frequency of one-half that of the M_CLK signal, is developed by the EXCLUSIVE-OR configuration 69a and the flip-flop 69b.

The X=Y=Z=0 condition cause the configurable frequency dividers 30 of the master and shadow clock generator units 12a, 12b to be reset to different values to test the reset and error check circuitry.

Figure 4:
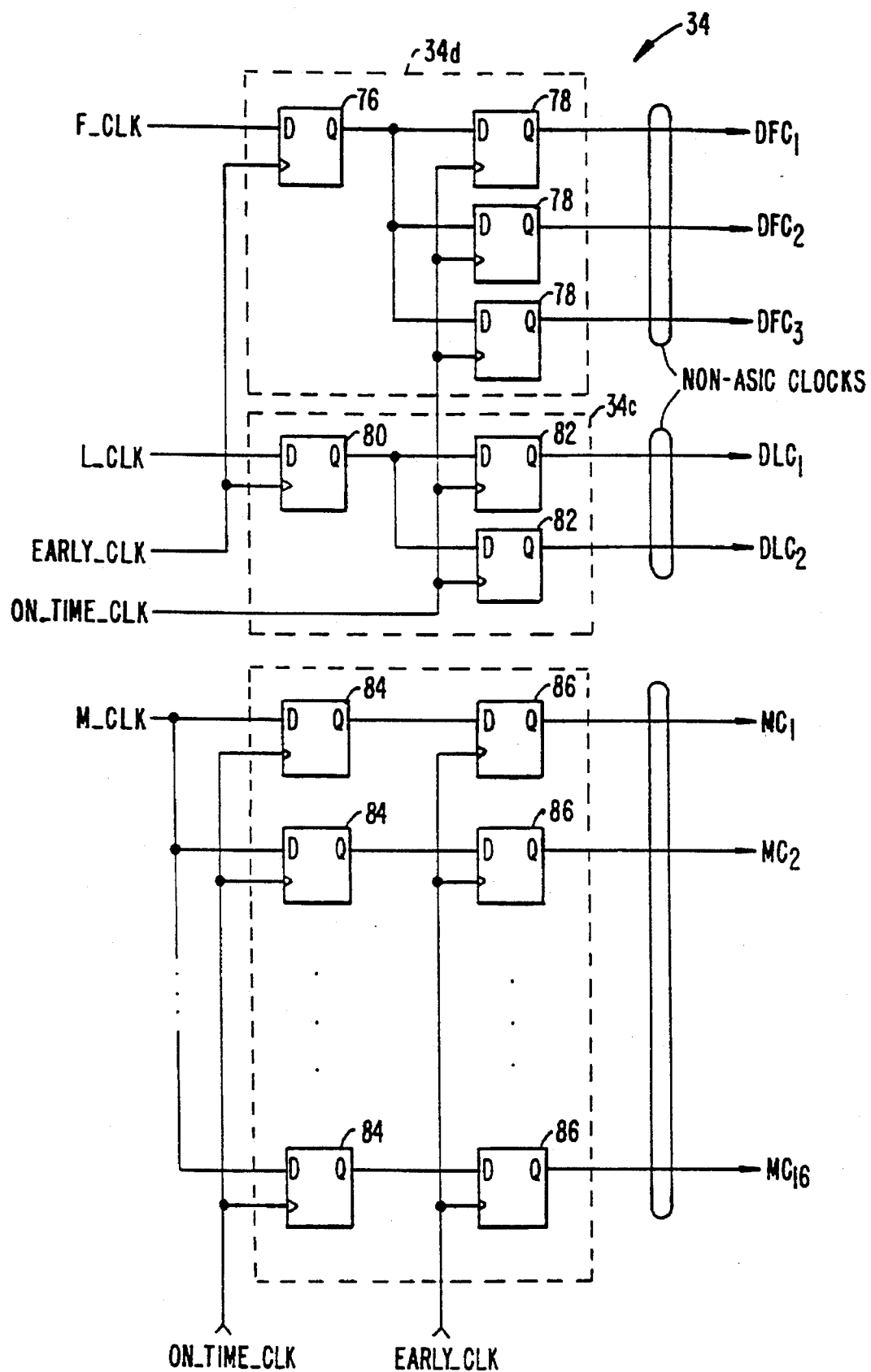
FIG. 4 is an illustration of the registration output circuitry used in FIG. 1.

Turning now to FIG. 4, the register groups 34a, 34c and 34d of the output registration section 24 are shown in greater detail to illustrate the structure and design all the register group. Although register group 34b is not shown, it should be understood that its construction is essentially the same as that of register groups 34a, 34b, and/or 34d.

The output registration section 34 is responsible for the low skew within each output clock signal group (e.g., $MC_1$, ..., $MC_{16}$) as well as for providing skew of one group of clock signals relative to another group, as explained above. As FIG. 4 shows, the F_CLK, which produces the output clock signals $DFC_1$, $DFC_2$, $DFC_3$, is applied to a first D type flip-flop 76 that is clocked by the EARLY_CLK clock signal. The output of the flip-flop 76 is applied to the data (D) inputs of three flip-flops 78, clocked by the ON_TIME_CLK signal, in effect transferring the F_CLK signal from the EARLY_CLK regime to the ON_TIME_CLK regime. The outputs of the flips flops 78 provide the three clock signals $DFC_1$, $DFC_2$, and $DFC_3$ from the output register group 34d.

In similar fashion the register group 34c includes an input flip-flop 80 that receives the L_CLK signal, and that is also clocked by the ON_TIME_CLK signal to drive the output flip-flops 78, clocked by the EARLY_CLK signal. The output clock signals ($DLC_1$, $DLC_2$) produced from the output registration group 34c, like those from the output registration group 34d, are in the ON_TIME_CLK signal regime. These output clock signals are used for non-ASIC devices.

The register group 34a similarly has a dual flip-flop (84, 86) configuration, one for each of the 16 output clock signals produced from the M_CLK signal in order to reduce loading and skew. Each input flip-flop 84 receives the M_CLK signal at its data (D) input 76, and is clocked by the ON_TIME_CLK signal. Each output flip_flop 86 receives the output (Q) of the corresponding input flip-flop 84, and is clock by the EARLY_CLK signal. Thus, unlike the clock signals produced from the register groups 34c and 34d (as well as 34b; see FIG. 1), the clock signals ($MC_1$, ..., $MC_{16}$) produced from the register group 34a are in the EARLY_CLK regime, and lag those from the other register groups by an amount, as indicated above, dictated by the delay line 24. The output clock signals $MC_1$, ..., $MC_{16}$ are for the ASIC devices, and are delayed to compensate for the skew inherent in the device, as discussed above.

Figure 5:
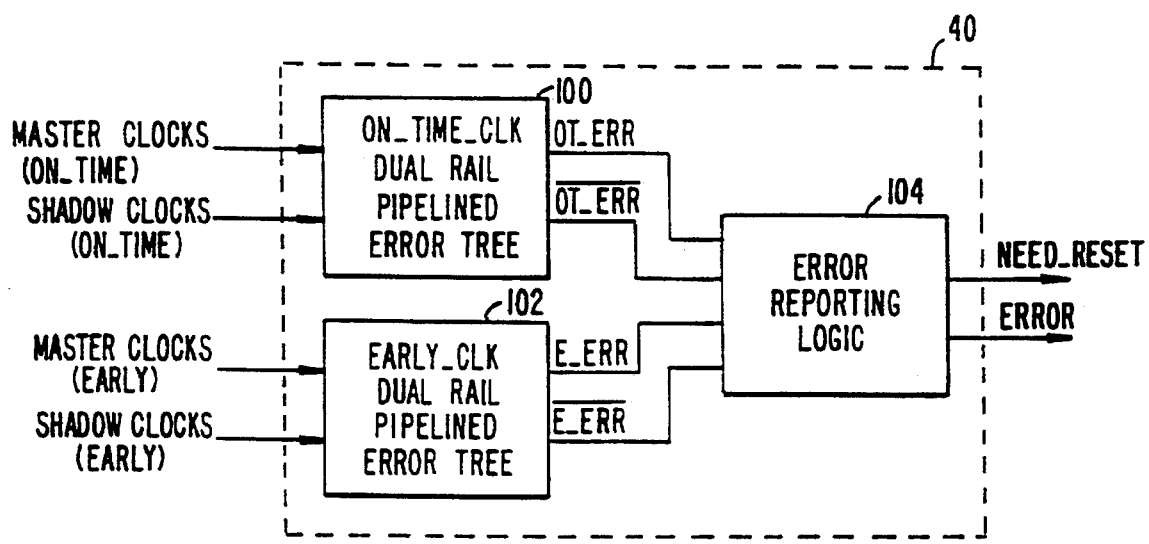
FIG. 5 is a block diagram of the self-checking error detection logic used to check outputs of one clock generator unit of FIG. 1 against the other.

Turning now to FIG. 5, the error detection logic 40 is shown as including a pair of dual-rail pipelined error trees 100, 102 coupled to error reporting logic 104. The error tree 100 receives those clock signals from the master and shadow clock generator units 12a, 12b that are in the ON_TIME_CLK clock regime to compare each output clock signal from the master clock generator unit 12a with its twin from the shadow clock generator unit 12b. Similarly, the error tree 102 operates in the EARLY_CLK regime to compare those master clock signals that are synchronized to the EARLY_CLK clock signal (e.g., $DMC_1$, ..., $DMC_4$) to one another. If a mis-match is detected between any output signal and its twin, that mis-match will be reported as the NEED_RESET and ERROR signals by the error reporting logic 104.

Figure 6:
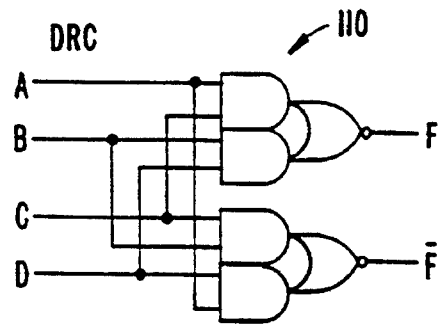
FIG. 6 is a illustration of the dual-railed checker used as a basic building block for the self-checking error detection logic of FIG. 5.

The error trees 100, 102 use self-checking logic, sometimes referred to as dual-rail checkers. As is illustrated in FIG. 6, a dual-rail checker (DRC), such as the DRC 110 shown, is usually implemented with four 2-input AND gates that drive the two, 2-input NOR gates. If either of the input pairs A, B, or C, D do not match, both of the outputs F, $\overline{F}$ will be at the same digital state. Conversely, if the input pairs A, B and C, D match, the outputs F, $\overline{F}$ will assume complementary states.

Figure 7:
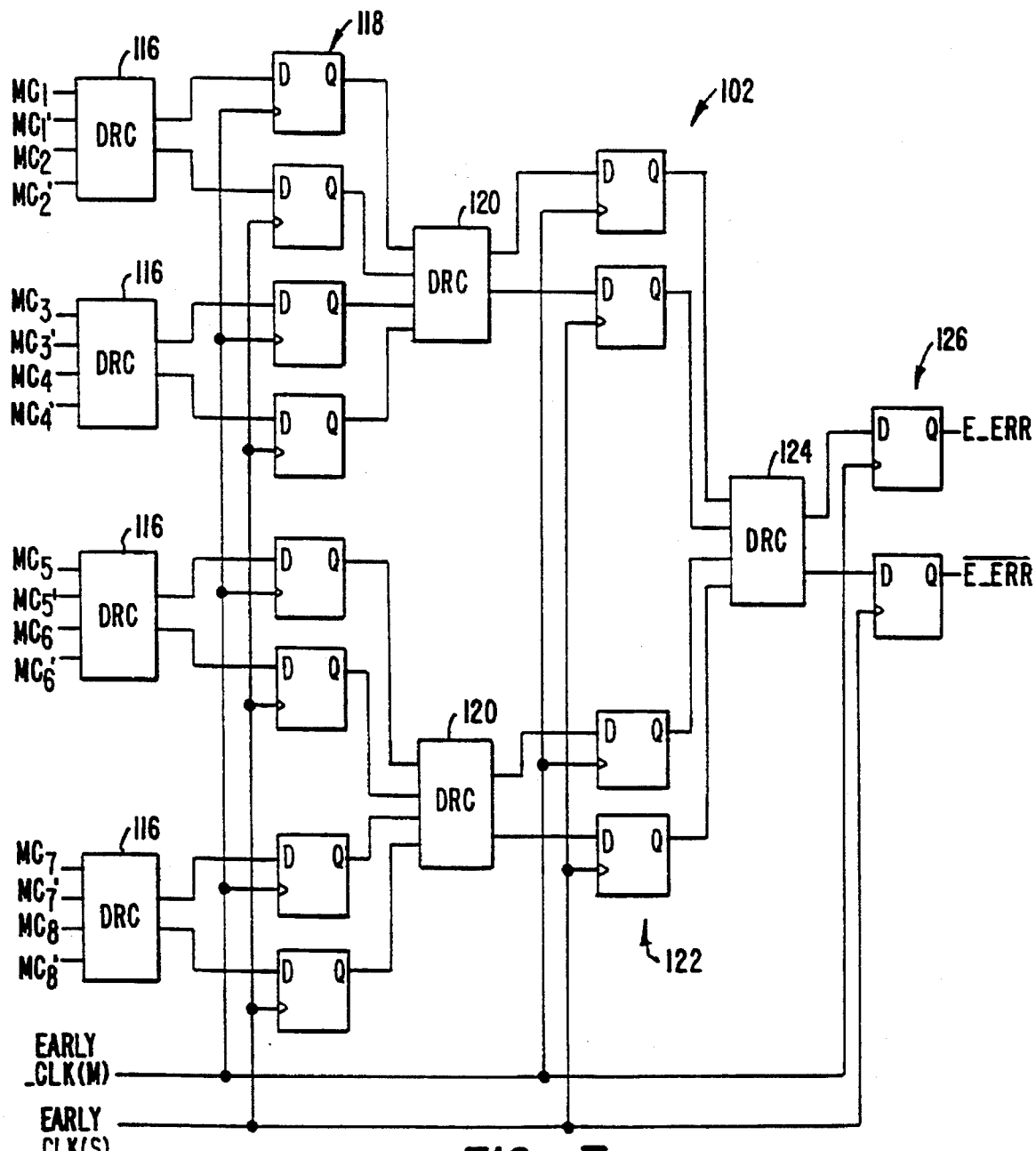
FIG. 7 is an illustration of a portion of an error tree used in the error detection logic of FIG. 5.

A representative portion of the error tree for the EARLY_CLK signal regime is shown in FIG. 7 to illustrate the pieplining used. Due to the frequencies of operation expected, and the type of error checking used (i.e., the DRCs), the error checking operation must take place in "diminishing" stages. As shown in FIG. 7, eight of the master clock signal outputs ($MC_1$, $MC_2$, ..., $MC_8$) from the master clock generator unit 12a and their twins ($MC_1'$, $MC_2'$, ..., $MC_8'$) provided by the shadow clock generator unit 12a are received by the DRC units 116. Each master output clock signal (e.g., $MC_1$) is compared to its twin provided by the shadow clock generator unit 12b (e.g., $MC_1'$) by one of the DRC units 116. The outputs of the DRC units 116 are clocked into first rank 118 of registers by the EARLY_CLK signals from the master clock generator unit 12a (EARLY_CLK(M)) and the shadow clock generator unit 12b (EARLY_CLK (S)). The outputs of the first rank 118 of registers are then compared in similar fashion by the rank of DRC units 120, and the results of that comparison clocked into the a next rank 122 of registers. Again, the outputs of the rank of registers 122 are compared by the DRC unit 124, and the results clocked into the final rank 126 of registers, whose outputs produce the early error signals (E_ERR, $\overline{E\_ERR}$).

Of course, it will be recognized by those skilled in this art, that the pipeline configuration for the error tree 102 will be much deeper than the three ranks 118, 122, 126 of registers shown, because 16 clock signals will be compared. However, for simplicity and ease of understanding, only eight of those signals are illustrated as being compared, resulting in only three ranks of registers. The structure of FIG. 7 illustrates the construction of both the error trees 100 and 102. The error tree 100 will produce error signals OT_ERR and $\overline{OT\_ERR}$ in the same manner as that illustrated for the error tree 102. If no error is detected by either of the error trees 100, 102, the states of the error signals OT_ERR and $\overline{OT\_ERR}$ (or E_ERR and $\overline{E\_ERR}$) will each be the complement of the other; conversely, if an error is detected, they will assume the same state.

Before continuing, it may be beneficial to state what should be obvious to those skilled in this art. At the frequencies contemplated here (e.g., in the tens of Mhz range) it will not take much to introduce skew in signals being communicated in the master (or shadow) clock generator units 12. It is a goal that the output clock signals of any group have little, if any, skew. Thus, consideration should be given to the layout of the clock generator units 12. For example, the F_CLK, M_CLK and L_CLK signal paths from the configurable frequency divider to the output registration groups should be kept substantially equal so that unequal path lengths to any one output registration group will not contribute skew to certain of the signals in that group, relative to others in that group.

The error tree 100 operates to check those output clock signals in the ON_TIME_CLK regime, and the error signals (OT_ERR and $\overline{OT\_ERR}$) it produces will also be in that regime. The error tree 102, on the other hand, operates to check those output clock signals that are in the EARLY_CLK regime so that its output error signals (E_ERR and $\overline{E\_ERR}$) will be in the EARLY_CLK regime. To combine them, one or the other must be transferred from one clock regime to the other. This is transfer is performed in the error reporting logic 104.

Figure 8:
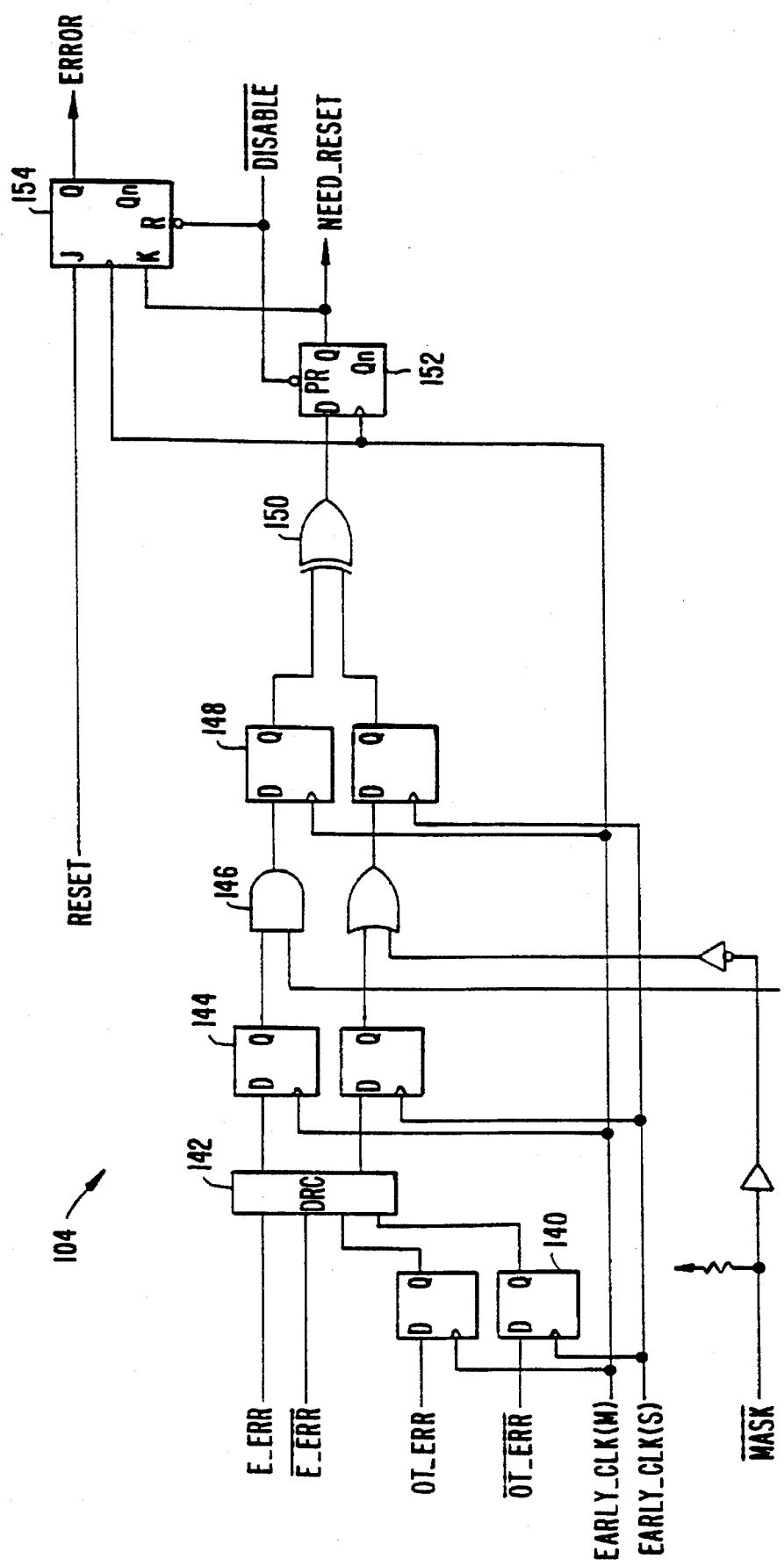
FIG. 8 is a schematic diagram of the error reporting logic that forms a part of the error detection logic of FIG. 5.

The error reporting logic 104, shown in greater detail in FIG. 8, receives the outputs OT_ERR and $\overline{OT\_ERR}$ from the error tree 100, and transfers them from the ON_TIME_CLK regime to the EARLY_CLK regime by first applying them to a pair of flip-flops 140, one of which is clocked by the EARLY_CLK(M) signal from the master clock generator unit 12a, and the other is clocked by the EARLY_

CLK(S) signal from the shadow clock generator 12b. The outputs of the pair of flip-flops 140, which are now in the EARLY_CLK regime, are coupled to a DRC unit 142 for comparison with each other and with the error signals produced by the error tree 102. The results of that comparison are passed to a register pair 144, and then through mask logic 146 to a register rank 148. The outputs of the register rank 148 are compared by an EXCLUSIVE-OR gate 150. A mismatch in any of the compared clock signals will cause the output of the EXCLUSIVE-OR gate 150 to be asserted, and to set the flip-flop 152, in turn asserting the NEED_RESET error signal. The NEED_RESET signal is latched by a J-K flip-flop 154 to produce the ERROR signal. As will be seen, the NEED_RESET signal will reset the clock generator system 10. When this is done, the NEED_RESET signal may well ultimately disappear. However, it may be that parts of the overall system with which the clock system 10 is used will require a more long-lasting error indication. The ERROR signal provides that longer-lasting indication.

The mask logic 146 is for test purposes: when the MASK signal is asserted, any clock signal mismatches are disregarded. In similar fashion, the reset may be disabled by asserting the DISABLE signal.

Figure 9:
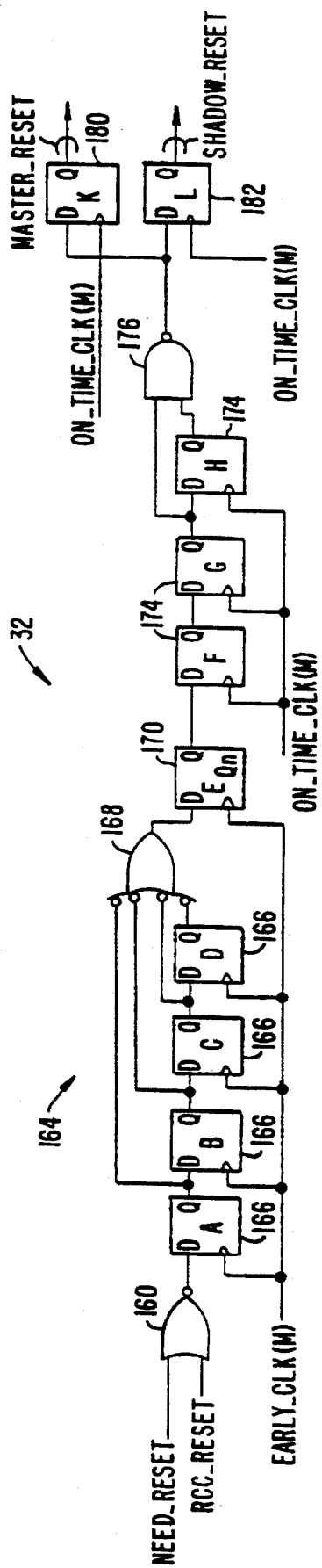
FIG. 9 is a schematic diagram of the reset logic forming a part of the clock generator unit of FIG. 1.

The NEED_RESET signal, as indicated above, is used to reset the configurable frequency divider 30 (FIG. 1) via the reset logic 32, which is illustrated in greater detail in FIG. 9. The NEED_RESET signal is received by a two input NOR gate 160, the output of which is coupled to a pulse stretching circuit 164, comprising four flip-flops 166, clocked by the EARLY_CLK(M) signal from the master clock generator 12a. Each of the outputs of the flip-flops 166 is coupled to a negative input OR gate 168, the output of which is coupled to the data (D) input of a flip-flop 170.

The reset logic 32 operates to synchronize the master and shadow clock generator units 12a, 12b. In order to ensure that the NEED_RESET signal (which may be just a pulse) is detected, that pulse is stretched by the pulse stretch circuitry 164. In addition, since the configurable frequency dividers 30 operate from the ON_TIME_CLK, the reset path must flow from the EARLY_CLK regime to the ON_TIME_CLK regime. However, this clock regime transfer raises a possibility that the circuit receiving the output of the flip-flop 170 may see a metastable condition at some combination of process, voltage, temperature, and group delay settings. This is unavoidable, but in order to minimize the probability of such metastable condition occurring, a three stage synchronizer, formed by the flip-flops 174 (clocked by the ON_TIME_CLK(M) signal from the master clock generator 12a) is used to receive the output of the flip-flop 170 to provide a low probability of mis-operation. A reset signal will be asserted only when the last two stages of the synchronizer agree, as detected by the NAND gate 176.

The output of the NAND gate 176 is applied to the two flip-flops, 180, 182 which are clocked by the ON_TIME_CLK signal from the master clock generator unit 12a. The flip-flop 180 asserts the MASTER_RESET signal that is coupled to the configurable frequency divider 30 (FIGS. 1 and 3) where it is used to preset the ring counter 60. A substantially identical reset signal, SHADOW_RESET signal, is synchronously generated by the flip-flop 182 which is applied to the shadow clock generator unit 12b for similar operation. The reset logic 32, by the way, is not replicated.

As FIG. 9 further shows, the NOR gate 160 receives a RCC_RESET signal. This is an externally produced signal for test purposes to force a mis-match indication and reset the clock generating system 10.

Figure 10:
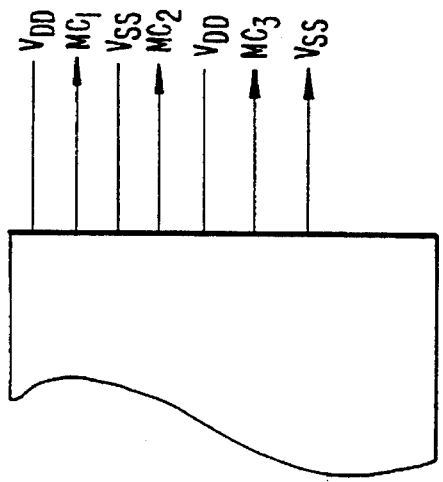
FIG. 10 illustrates separating the clock signals that leave the clock generating system of FIG. 1 by power and ground.

As is known, particularly at the frequencies of operation here contemplated (50 Mhz–200 Mhz for clock generator 20) various output buffers, particularly the output buffers 38 that communicate the clock signals generated by the master clock generator unit 12a, be affected by lead inductance of power ($V_{DD}$) and ground ($V_{SS}$). In an effort to balance these inductances, the clock signals are separated from one another as they emanate from the integrated circuit chip on which the clock generator system 10 is formed. Thus, as illustrated in FIG. 10, each signal output from the chip (e.g., as illustrated in FIG. 10, output clock signals $MC_1$, $MC_2$, and $MC_3$ are each alternatively separated from one another by a power ($V_{DD}$) or ground ($V_{SS}$) lead. This will not exactly balance the inductances, but will approach a balance.

In addition, such frequencies as are contemplated here, when communicated on the 25 inch printed circuit leads from the clock generator system 10 to other devices on the printed circuit board (e.g., devices 52, 54, 56 - FIG. 2), can experience reflections, which will affect the very small rise and fall times of the clock signal being generated, in turn causing skew. In addition, jitter or skew is introduced when the path propagation time begins to become a significant portion of the period of the period of the clock signal being communicated. The energy in a state transition is still present on the path when the next transition is launched, resulting in interference between the two waves, and differences in the transition time at the receiving end of the path.

Figure 11:
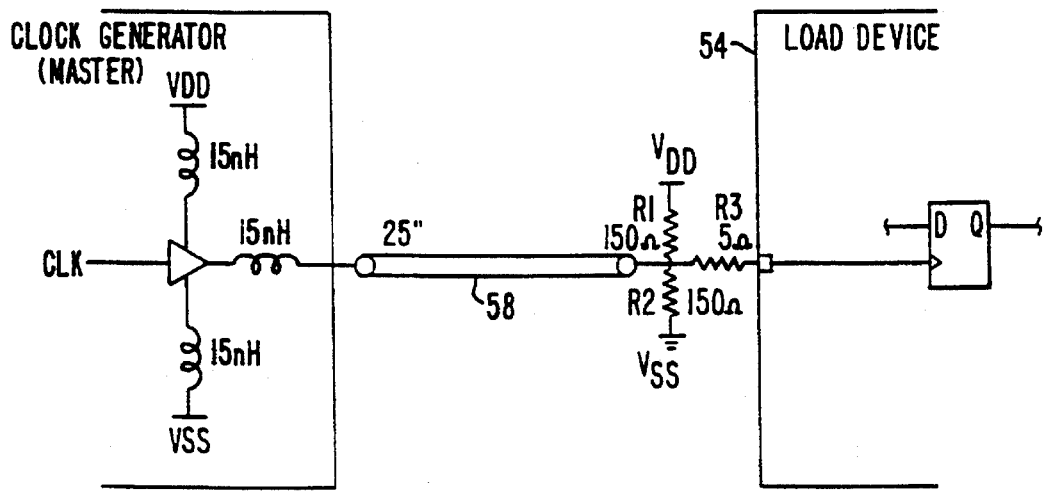
FIG. 11 is a circuit diagram illustration of the termination used to minimize clock signal reflections on the clock distribution lines that communicate clock signals from the clock generator system of FIG. 1 to various of the devices shown in FIG. 2.

In order to minimize such skew and jitter, a parallel-series resistance termination is used to terminate the signal path 58, and to isolate the load capacitance from the signal path. Thus, as illustrated in FIG. 11, resistors R1 and R2 are connected between the supply voltage ($V_{DD}$) and ground ($V_{SS}$) of the board 50 (FIG. 2), and proximate the input terminal (at the receiver end of the signal path 58 carrying the clock signal) of the device to which the path 58 connects. In addition, a series resistor R3 is used to isolate the path 58 between the parallel termination and the input terminal (i.e., the receiver).

The values of the terminating resistances R1, R2 are selected to be the Thevenin equivalent of the path impedance. The value of the isolating resistance R3 is not all that critical, although too small a resistance will increase the reflection coefficient. If too large, the delay through the RC network formed by the resistance and any input capacitance of the device will be excessive and contribute to skew.

The resistance values used for R1 and R2 are 150 ohm each to form the parallel termination, and 5 ohms for the series resistor R3 for the isolation.

What is claimed is:

1. A clock generator circuit for producing a plurality of clock signals, the clock generator comprising:

a source of a master clock signal;

a delay element coupled to receive the master clock signal to produce a delayed clock signal;

a frequency divider that receives the delayed clock signal to produce therefrom a divided clock signal;

a first flip-flop having a data input coupled to receive the divided clock signal, a clock input receiving the master clock signal, and an output; and for each of a first predetermined number of the plurality of clock signals having a first frequency, a second flip-flop having a data input receiving the output of the first flip-flop, a clock input receiving the delayed clock signal, and an output whereat a corresponding one of said first predetermined number of the plurality of clock signals is provided.

2. The clock generator of claim 1, further including a third flip-flop having a data input receiving the divided clock signal, a clock input receiving the delayed clock signal, and an output; and for each of second predetermined number of the plurality of clock signals having a second frequency, a fourth flip-flop having a data input receiving the output of the third flip-flop, a clock input receiving the master clock signal, and an output whereat a corresponding one of the second predetermined number of the plurality of clock signals is provided.

3. The clock generator of claim 1, wherein the delay element comprises a signal line trace formed on a printed circuit board.

4. The clock generator of claim 1, wherein the divided clock signal has a frequency substantially one-half the master clock frequency.

5. The clock generator of claim 1, for further producing another plurality of clock signals of a second frequency, comprising:

a third flip-flop having a data input coupled to receive the divided clock signal of the first frequency, a clock input receiving the delayed clock signal, and an output; and for each of a second predetermined number of the another plurality of clock signals, a fourth flip-flop having a data input receiving the output of the third flip-flop, a clock input receiving the mater clock signal, and an output whereat a corresponding one of the second predetermined number of the another plurality of clock signals is provided.

* * * * *